United States Patent [19]
Wietecha et al.

[11] Patent Number: 5,617,473
[45] Date of Patent: Apr. 1, 1997

[54] SIGN BIT INTEGRATOR AND METHOD

[75] Inventors: Stanley F. Wietecha, South Bound Brook; John A. Olmstead, Cape May Court House, both of N.J.

[73] Assignee: Harris Corporation, Melbourne, Fla.

[21] Appl. No.: 493,454

[22] Filed: Jun. 23, 1995

[51] Int. Cl.[6] ............................. H04M 1/74; H04M 9/00; H03M 1/06; H03M 1/00
[52] U.S. Cl. .................. 379/399; 379/386; 379/414; 364/833; 341/118; 341/135; 327/307; 327/336; 327/341
[58] Field of Search .................... 364/829, 833, 364/839, 840; 379/386, 399, 414; 341/118, 135; 327/336, 341, 307; 375/327; 333/19

[56] References Cited

U.S. PATENT DOCUMENTS

| | | | |
|---|---|---|---|
| 3,953,805 | 4/1976 | Couvillon | 327/307 |
| 4,282,515 | 8/1981 | Patterson, III | 341/118 |
| 4,308,504 | 12/1981 | Ida | 330/253 |
| 4,377,759 | 3/1983 | Ohhata et al. | 327/337 |
| 4,383,188 | 5/1983 | Crosby | 341/136 |
| 4,524,425 | 6/1985 | Bertails | 364/825 |
| 4,590,458 | 5/1986 | Evans et al. | 341/118 |
| 4,623,854 | 11/1986 | Kuraishi | 333/173 |
| 4,805,192 | 2/1989 | Confalonieri et al. | 341/118 X |
| 4,875,045 | 10/1989 | Lynch et al. | 341/139 |
| 4,972,189 | 11/1990 | Polito et al. | 341/118 |
| 4,996,529 | 2/1991 | Connell | 341/118 |
| 5,210,709 | 5/1993 | Tani et al. | 364/724.03 |
| 5,276,446 | 1/1994 | Sellars | 341/118 |
| 5,296,857 | 3/1994 | Carbolante | 341/144 |
| 5,523,756 | 6/1996 | Mariuz et al. | 341/118 |

*Primary Examiner*—Ahmad F. Matar
*Assistant Examiner*—T. Devendra Kumar
*Attorney, Agent, or Firm*—Rogers & Killeen

[57] ABSTRACT

A sign bit integrator and method for generating a signal to correct an offset in a signal processing system that can distort the output from the system. A charge pulse is generated when the sign of a input signal is sampled in order to provide an offset correction signal with a polarity opposite that of offsets in the system. The charge pulse is provided to a pair of transistors whose size ratio sets the magnitude of the charge pulse. The polarity of the charge pulse is set responsive to a sign bit in the input signal. An integrator capacitor provides the offset correction signal to the signal processing system. A third transistor may be switchably substituted for one of the pair of transistors to change the ratio of sizes and thus change the magnitude of the charge pulse to thereby change the speed with which the offset correction is made. The sign bit integrator and method may be used to correct distortion in a voice signal in a telephone system.

17 Claims, 1 Drawing Sheet

5,617,473

SIGN BIT INTEGRATOR AND METHOD

BACKGROUND OF THE INVENTION

The present invention relates to devices and methods for removing distortion from voice processing systems, and more particularly to a sign bit integrator and method that correct offsets in telephone system components that distort a voice signal.

Systems that process voice signals include a number of components that receive direct current inputs that can cause voice signal distortion. Voice signal processing systems assume that the voice signal is composed of sine waves that are symmetrical with the same number of negative and positive excursions. However, some components, such as amplifiers and comparators, receive direct current inputs that can cause the components to drift so that the signal is no longer symmetrical, causing distortion of the voice signal. The direct current inputs, denoted offsets, may be counterbalanced by inserting a corrective signal. The present invention is directed to generation of such corrective signals.

While offset correction is desirable in a variety of voice processing systems, it has been found that correction is especially desirable in telephone systems where distortion caused by offsets may seriously degrade signal quality. Offsets are unavoidably inserted in various telephone system components, and it has been found that correction of these offsets is particularly effective when performed in coder/decoders (CODECs) located at the interface between the subscriber and the central office.

In a CODEC, a sign bit integrator may be used to insert the offset corrections. The sign bit integrator continuously samples the sign bits of received digital voice signals and averages them over time to determine whether offsets are affecting the symmetry of the positive and negative excursions of the voice signal. The lowest frequency that is handled by a CODEC is about 200 Hz, and sign bit sampling typically takes place at a frequency of about 8 kHz. Thus, there may be up to 40 samples per cycle and about 20 samples before the polarity of an input signal reverses. In a perfect (no offset) system, the number of samples of each polarity would be same. However, in practice such perfect systems do not exist and offset corrections are required.

Accordingly, it is an object of the present invention to provide a novel sign bit integrator and method for correcting offsets in a voice signal processing system.

It is another object of the present invention to provide a novel sign bit integrator and method for generating an offset correction signal having a polarity opposite the polarity of the offset.

It is yet another object of the present invention to provide a novel sign bit integrator and method for generating an offset correction signal with a variable magnitude so that the speed with which the offset is corrected may be selected.

It is still another object of the present invention to provide a novel sign bit integrator and method for generating an offset correction signal in which a current mirror for setting the magnitude of the corrective signal includes a pair of transistors with a ratio of active area sizes selected to set the magnitude.

It is a further object of the present invention to provide a novel sign bit integrator for generating an offset correction signal in which a current mirror for setting the magnitude of the offset correction signal includes plural transistors with diverse ratios of active area sizes and a switch for selecting a pair of the transistors to set the magnitude.

It is yet a further object of the present invention to provide a novel sign bit integrator and method for generating a signal for correcting distortion in a voice signal in a telephone system CODEC in which an inverter generates an output when a voice signal is sampled in the CODEC, a load capacitor generates a charge pulse upon receipt of the output from the inverter, a current mirror sets a magnitude and polarity of the charge pulse, and an integrator capacitor receives the charge pulse and provides it as an offset correction signal to the CODEC.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
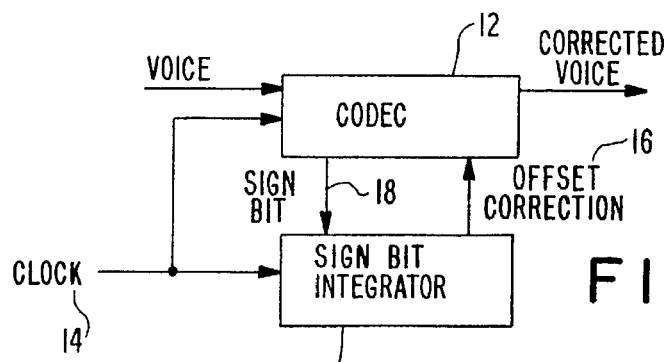
FIG. 1 is a block diagram of the connection of the present invention to a CODEC.

With reference now to FIG. 1, an embodiment 10 of the sign bit integrator of the present invention may be used with a telephone system CODEC 12. CODEC 12 processes voice signals that may be distorted by offsets introduced by system and/or CODEC components. The sign (polarity) of the voice signals in CODEC 12 is periodically sampled, with the periodicity of the sampling being set by a clock signal 14 that may be provided to both integrator 10 and CODEC 12. Integrator 10 generates a charge pulse at each clock signal and sets the magnitude and polarity of the charge pulse as needed so that the charge pulse may be provided to CODEC 12 as an offset correction signal 16. The polarity of the charge pulse is changed when the polarity of the sign bit 18 in the voice signal changes. Offset correction signal 16 is provided to CODEC 12 and combined with the voice signal therein to correct the offsets and reduce distortion in the voice signal. CODEC 12 may be conventional.

Figure 2:
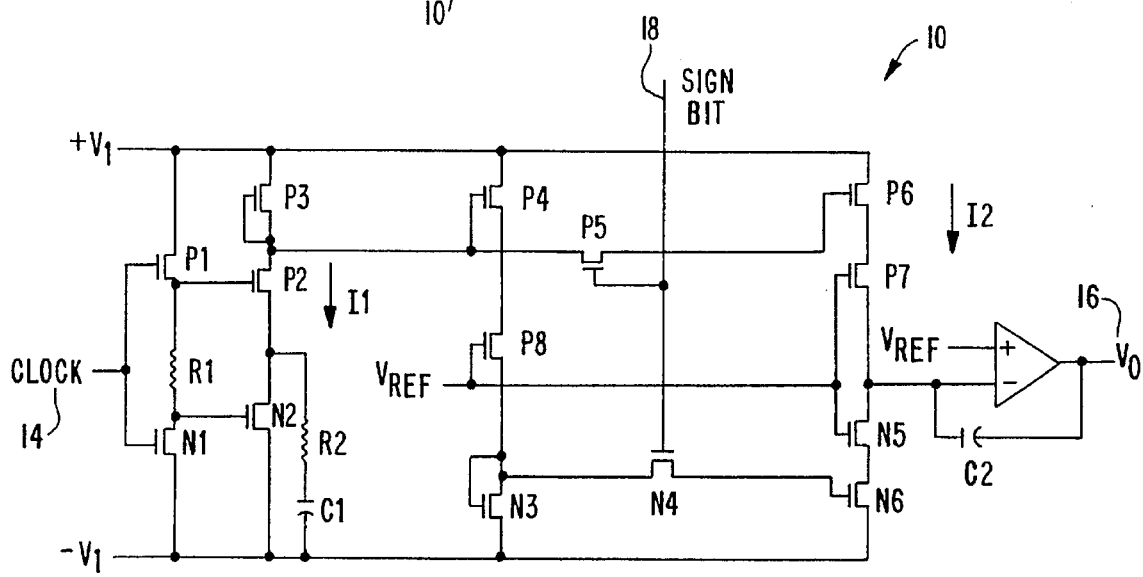
FIG. 2 is a circuit diagram of an embodiment of the present invention.

In a preferred embodiment of the present invention, and with reference to FIG. 2, the magnitude of offset correction signal 16 may be set as desired. Current pulses may be generated by charging and/or discharging currents in an inverter formed by transistors P2 and N2, where resistor R2 and capacitor C1 are the load. (The transistors may be field effect transistors with the type indicated by a N or P designation.) The inverter may be operated by clock 14 to provide current pulses each time the voice signal is sampled. Resistor R1 provides non-overlapping switching for transistors P2 and N2.

Figure 3:
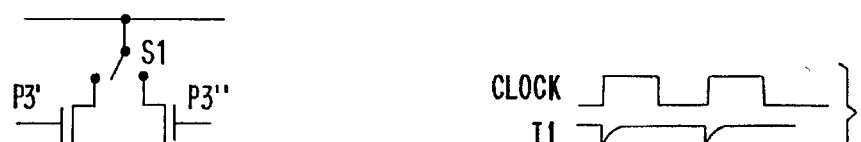
FIG. 3 is an illustration of waveforms found in the present invention.

The clock signal may provide high and low signals and current pulse I1 may be provided at the leading edge of each cycle, such as illustrated in FIG. 3.

Load capacitor C1 generates a charge pulse ∫di/dt that is equal to C1V1. The charge pulse is transferred to integrator capacitor C2, with the magnitude and polarity of the charge pulse being set in the manner discussed below.

The magnitude of the charge pulse may be changed by the current ratio I2/I1. This ratio is set by the ratio of the size of the active area of transistor P6 to that of transistor P3. Transistors P6 and P3 may be connected as current mirrors (as shown). In a preferred embodiment, transistors P6 and P3 are in an integrated circuit and have active areas with equal length L so that the size ratio is set by the active area width W. For example, transistor P6 can have W=1 and transistor P3 can have W=m, where m then sets the change in magnitude of the charge pulse. The magnitude of offset correction signal Vo may be determined from:

$$V1 \times C1 \times W_{P6}/W_{P3} = Vo \times C2 \quad (1)$$

Figure 4:
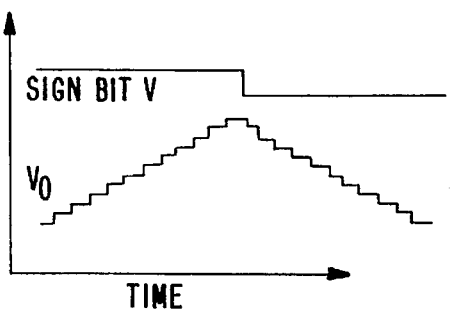
FIG. 4 illustrates the relationship between the sign bit signal and the offset correction signals of the present invention.

The polarity of the charge pulse may be set by the voltage level of sign bit signal 18 through operation of transistors P5 and N4. The relationship of sign bit signal 18 to offset correction signal Vo may be seen in the example of FIG. 4. For an 8 kHz clock signal operating with a CODEC handling a 200 Hz voice signal, the integrator can be moving in one direction (there is no change of polarity) for about 2.5 ms. During this period the offset correction signal should not cause a shift of more than one least significant bit, or about 10 uV per cycle of the 8 kHz clock signal. The circuit of FIG. 2 is able provide a 10 uV/cycle offset correction signal.

Figure 5:
FIG. 5 is a partial circuit diagram of an embodiment of the switched transistors of the present invention.

In a further embodiment, and with reference now to FIG. 5, transistor P3 may be replaced by another transistor with a different size active area so that the size ratio and magnitude of offset correction signal Vo may be selectively changed. For example, a switch S1 may be connected to select one of transistor P3' and transistor P3" for connection to the circuit. Switch S1 may be used to select the speed with which the offset correction is applied. A smaller transistor size ratio provides a smaller step for each offset correction signal Vo to decrease the rate the correction and to lower the correction overshoot. A faster correction (with commensurately higher overshoot) may be desired during system start-up or test.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A sign bit integrator for generating a signal for correcting an offset in a signal processing system comprising:

an inverter for generating a periodic output;

a load capacitor for generating a charge pulse upon receipt of the output from said inverter;

circuit means comprising three or more transistors of different sizes and a switch for connecting two of said transistors to said load capacitor for changing the magnitude of the charge pulse by a ratio of sizes of the connected two of said transistors;

a sign bit receptor connected to said circuit means for setting a polarity of the charge pulse responsive to a sign bit signal; and an integrator capacitor for receiving the charge pulse as set by said circuit means and said sign bit receptor, whereby an output from said integrator capacitor is a signal for correcting an offset in the signal processing system.

2. The sign bit integrator of claim 1 wherein the ratio of sizes of a first pair of said three transistors is larger than the ratio of sizes of a second pair of said three transistors, whereby said first pair of transistors provide a faster correction of the offset.

3. A sign bit integrator for generating a signal for correcting distortion in a voice signal in a telephone system CODEC comprising:

an inverter for generating an output when a voice signal is sampled in a telephone system CODEC;

a load capacitor for generating a charge pulse upon receipt of the output from said inverter;

a current mirror connected to said load capacitor for selecting a magnitude of the charge pulse, said current mirror comprising plural transistors wherein a ratio of sizes of two of said plural transistors defines the magnitude of the charge pulse;

a sign bit receptor connected to said current mirror for setting a polarity of the charge pulse responsive to a sign bit signal in the voice signal; and an integrator capacitor for receiving the charge pulse as changed by said current mirror and said sign bit receptor and for providing an output to the CODEC, whereby the output from said integrator capacitor is a signal for correcting a distortion causing offset in the CODEC.

4. The sign bit integrator of claim 3 wherein said current mirror further comprises a switch for selecting the two transistors that define the magnitude of the charge pulse from among said plural transistors.

5. A sign bit integrator for generating a signal of selectable size for correcting an offset in a signal processing system comprising:

sampling means for periodically generating a charge pulse;

a current mirror connected to said sampling means for setting a magnitude of the charge pulse, said current mirror comprising, plural transistors having different size active areas, a switch for selecting two of said plural transistors, said selected transistors having a ratio of sizes that defines the magnitude of the charge pulse, a sign bit receptor connected between said selected transistors for setting a polarity of the charge pulse responsive to a sign bit signal; and output means connected to said current mirror for providing a signal for correcting an offset in the signal processing system.

6. The sign bit integrator of claim 5 wherein said plural transistors are in an integrated circuit and have active areas of the same length and unequal widths.

7. The sign bit integrator of claim 5 wherein said sampling means comprises an inverter for generating an output when a voice signal is sampled in a telephone system CODEC, and a load capacitor for generating the charge pulse upon receipt of the output from said inverter.

8. The sign bit integrator of claim 7 wherein said output means comprises an integrator capacitor for receiving the charge pulse as set by said current mirror and said sign bit receptor and for providing an output to the CODEC.

9. A method of generating a signal for reducing distortion in a voice signal in a telephone system CODEC comprising the steps of:

(a) generating a charge pulse when a voice signal is sampled in a telephone system CODEC;

(b) setting a magnitude of the charge pulse by providing the charge pulse to a current mirror having plural diversely sized transistors wherein a ratio of sizes of two of the plural transistors sets the magnitude of the charge pulse;

(c) setting a polarity of the charge pulse responsive to a sign bit signal in the voice signal; and (d) providing the charge pulse with the set magnitude and polarity to the CODEC as an offset correction signal.

10. The method of claim 9 further comprising the step of selecting a further one of the plural transistors to be one of the two transistors to thereby selectably change the magnitude of the charge pulse.

11. A sign bit integrator for generating a signal for correcting an offset in a signal processing system comprising:

an input means for generating a charge pulse;

a current mirror connected to said input means for mirroring the charge pulse to an output means, said current mirror comprising, plural transistors having different sizes wherein a ratio of the sizes defines a magnitude of the mirrored charge pulse;

a sign bit receptor connected to said current mirror for setting a polarity of the mirrored charge pulse responsive to a sign bit signal; and said output means being connected to said current mirror for providing a signal for correcting an offset in the signal processing system.

12. The sign bit integrator of claim 11 wherein said plural transistors are MOS transistors.

13. The sign bit integrator of claim 11 wherein said plural transistors are in an integrated circuit and have active areas of the same length and unequal widths.

14. The sign bit integrator of claim 11 wherein the signal processing system is a telephone system CODEC and wherein said input means comprises an inverter for generating an output to a load capacitor for generating the charge pulse when a voice signal is sampled in the CODEC.

15. The sign bit integrator of claim 11 wherein said output means comprises an integrator capacitor for receiving the mirrored charge pulse as set by said sign bit receptor.

16. The sign bit integrator of claim 11 further comprising a second current mirror connected to said input means for mirroring the charge pulse to said output means, and wherein said sign bit receptor is connected to said second current mirror so that said current mirror and said second current mirror are for setting opposite polarities of the mirrored charge pulse responsive to the sign bit signal.

17. The sign bit integrator of claim 16 wherein said plural transistors are MOS transistors of a first conductivity type and wherein said second current mirror comprises plural MOS transistors of a second conductivity type.

* * * * *